(12) United States Patent
Lee

(10) Patent No.: US 8,686,498 B2
(45) Date of Patent: Apr. 1, 2014

(54) LATERAL DOUBLE DIFFUSED MOS DEVICE AND METHOD FOR MANUFACTURING THE SAME

(75) Inventor: Mueng-Ryul Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 194 days.

(21) Appl. No.: 13/038,876

(22) Filed: Mar. 2, 2011

(65) Prior Publication Data

US 2011/0215402 A1   Sep. 8, 2011

(30) Foreign Application Priority Data

Mar. 3, 2010  (KR) .................. 10-2010-0019088

(51) Int. Cl.
*H01L 29/76* (2006.01)
*H01L 29/66* (2006.01)
*H01L 31/101* (2006.01)
*H01L 31/113* (2006.01)

(52) U.S. Cl.
USPC ........... 257/335; 257/336; 257/339; 257/343; 257/408; 257/409; 257/493; 257/E29.066; 257/E29.258

(58) Field of Classification Search
USPC ............ 438/283, 195, 286, 291; 257/E29.04, 257/335, 336, 339, 340, E29.027
See application file for complete search history.

(56) References Cited

U.S. PATENT DOCUMENTS

| 5,041,895 | A  | * | 8/1991 | Contiero et al. | ............... | 257/370 |
| 6,909,143 | B2 | * | 6/2005 | Jeon et al. | ...................... | 257/335 |
| 8,530,965 | B2 | * | 9/2013 | Kim | ............................ | 257/335 |
| 2004/0222488 | A1 | * | 11/2004 | Abadeer et al. | ................ | 257/510 |
| 2004/0238913 | A1 | * | 12/2004 | Kwon et al. | ................... | 257/492 |
| 2006/0091503 | A1 | * | 5/2006 | Wu et al. | ........................ | 257/640 |
| 2006/0124999 | A1 | * | 6/2006 | Pendharkar | ................... | 257/335 |
| 2007/0054464 | A1 | * | 3/2007 | Zhang | ............................ | 438/424 |
| 2008/0197408 | A1 | * | 8/2008 | Disney et al. | ................. | 257/335 |

* cited by examiner

*Primary Examiner* — Zandra Smith
*Assistant Examiner* — Tsz Chiu
(74) *Attorney, Agent, or Firm* — Lee & Morse, P.C.

(57) ABSTRACT

A semiconductor device is provided. The semiconductor device includes a gate on a substrate, a source region at a first side of the gate, a first conductive type body region under the source region, a second conductive type drain region at a second side of the gate, a device isolation region in the substrate between the source region and the drain region and overlapping part of the gate, and a first buried layer extending in a direction from the source region to the drain region, the first buried layer under the body region, overlapping part of the device isolation region, and not overlapping the drain region.

18 Claims, 7 Drawing Sheets

LATERAL DOUBLE DIFFUSED MOS DEVICE AND METHOD FOR MANUFACTURING THE SAME

BACKGROUND

1. Field

Embodiments relate to a semiconductor device. More particularly, the embodiments relate to a semiconductor device with improved operating characteristics.

2. Description of the Related Art

Compared to bipolar transistors, typical power MOS Field Effect Transistors (MOSFET) have advantages including higher power gain, a simpler gate drive circuit, and no time delay related to accumulation or recombination of minor carriers. The accumulation or recombination of minor carriers occurs during a turn off period. Therefore, MOS transistors are widely used during control, logic, and power switch functions.

For power switch functions, DMOS transistors, such as Lateral Double Diffused MOSFET (LDMOS), are widely used. LDMOS uses double diffusion technology.

SUMMARY

Embodiments are therefore directed to a semiconductor device, which substantially overcomes one or more of the problems due to the limitations and disadvantages of the related art.

It is therefore a feature of an embodiment to provide a semiconductor device with increased breakdown voltage and reduced turn on resistance.

It is therefore another feature of an embodiment to provide a semiconductor device with increased breakdown voltage and reduced turn on resistance.

At least one of the above and other features and advantages may be realized by providing a semiconductor device which includes a gate formed on a substrate; a source region formed at one side of the gate; a first conductive type body region formed under the source region; a second conductive type drain region formed at the other side of the gate; an device isolation region formed in the substrate between the source region and the drain region and overlapped with a part of the gate; and a first buried layer extended to a direction from the source region to the drain region, placed under the body region, overlapped with a part of the device isolation region, and not overlapped with the drain region.

The buried layer may overlap with about half of the device isolation region.

A second buried layer may be placed under the first buried layer. The first buried layer may be the second conductive type and the second buried layer may be the first conductive type.

A first well may have the first conductive type formed under the body region. A second well may have the second conductive type formed at the other side of the gate. The first well may contact the first buried layer.

The device isolation region may be adjacent to the drain region and may be separated from the source region.

The device isolation region may be a shallow trench isolation (STI).

The source region may include a first source region, the source region may have a first conductive type. The second source region may be adjacent to the first source region and may have a second conductive type.

The doping concentration of the first buried layer may be higher than the doping concentration of the second buried layer.

A drift region may be formed in the substrate on the first buried layer and may be separated from the first buried layer.

At least one of the above and other features and advantages may also be realized by providing a semiconductor device which includes a gate formed on a substrate; a source region formed at one side of the gate; a drain region formed at the other side of the gate; a body region having a first conductive type and formed under the source region; a first well having the first conductive type and formed under the body region; a device isolation region which is adjacent to the drain region, formed in the substrate, and overlapped with a part of the gate; and a first buried layer which is extended to a direction from the source region to the drain region and formed under the first well, wherein when a reverse bias is applied to the source region and the drain region, an electric field formed one side and the other side of the device isolation region is substantially identical.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2010-0019088, filed on Mar. 3, 2010, in the Korean Intellectual Property Office, and entitled: "Semiconductor Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that when an element such as a layer, region or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

Spatially relative terms, such as "below," "beneath," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Like numbers refer to like elements throughout.

Embodiments described herein will be described referring to plan views and/or cross-sectional views by way of ideal schematic views of the invention. Accordingly, the exemplary views may be modified depending on manufacturing technologies and/or tolerances. Therefore, the embodiments are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the embodiments.

Semiconductor devices, according to exemplary embodiments, are described using the structure of lateral DMOS. However, embodiments are not limited thereto. Embodiments also include a structure of lateral high voltage transistors; e.g. an insulator gate bipolar transistor (IGBT), which has a similar structure. Conductive type is described using an N-type lateral DMOS transistor. However, a P-type DMOS transistor can also be applied to the embodiments. Thus, the N-type and P-type can be exchanged.

Figure 1:
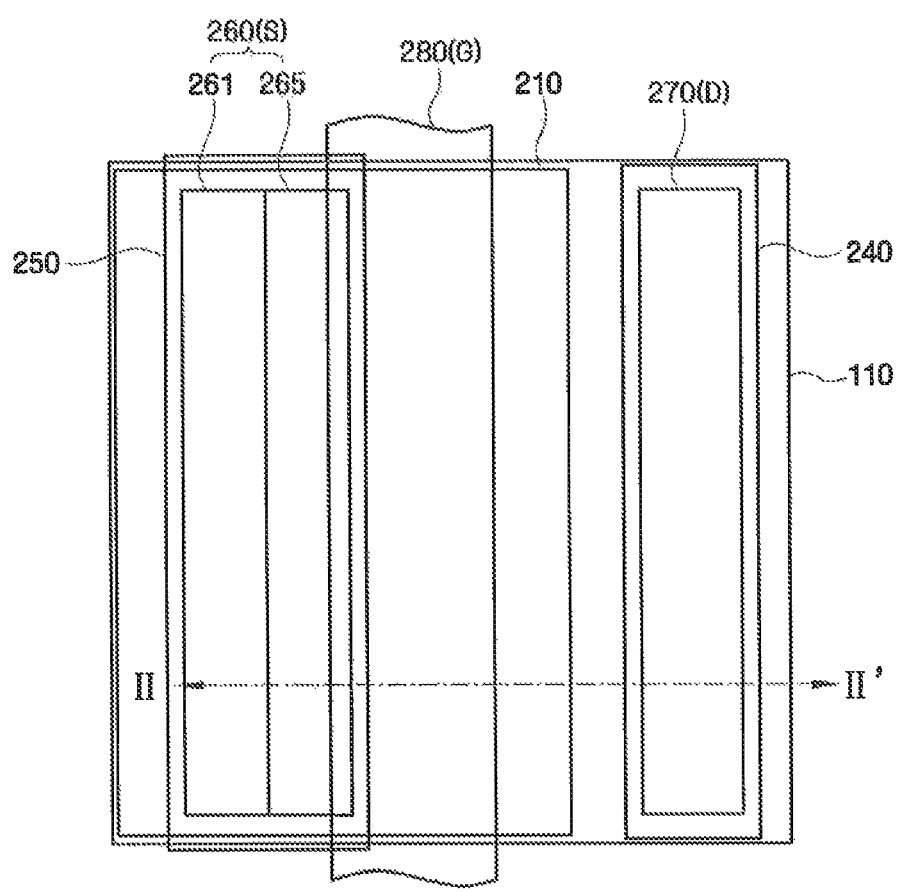
FIG. 1 illustrates a layout of a semiconductor device according to an exemplary embodiment.
Figure 2:
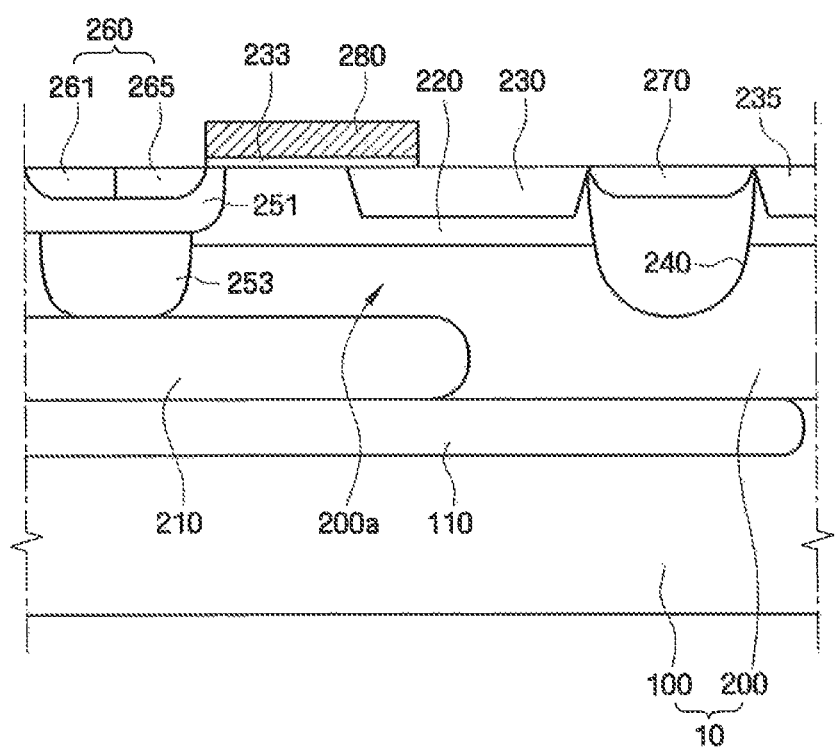
FIG. 2 illustrates a sectional view taken along a line II-II' of FIG. 1.
Figure 4:
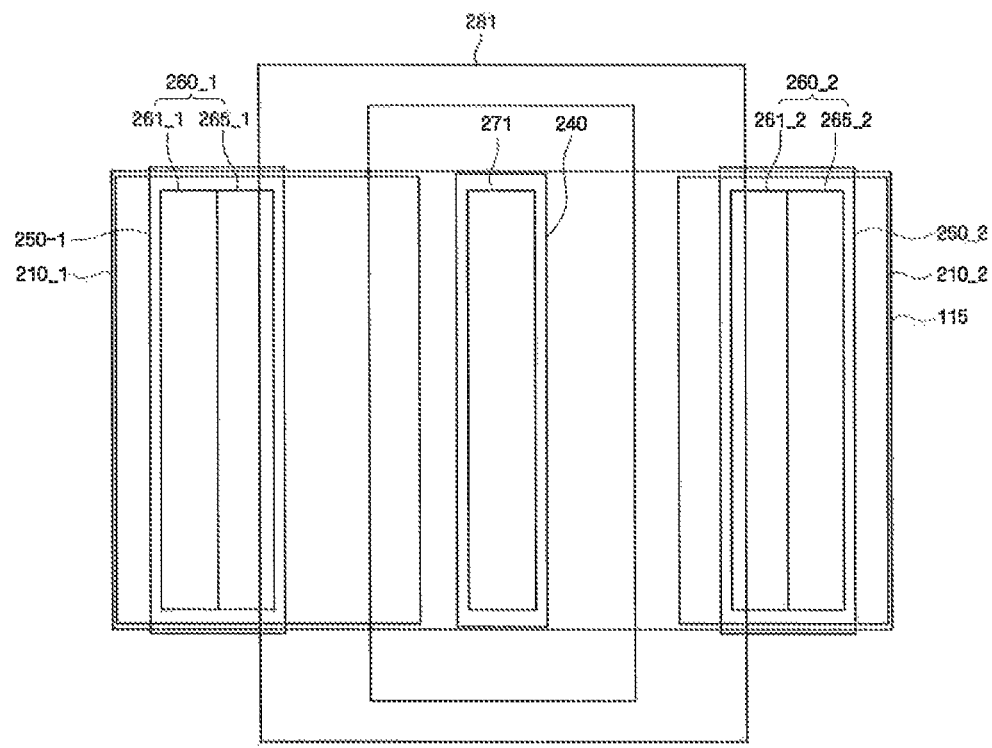
FIGS. 4 and 5 illustrate views of a semiconductor device according to another exemplary embodiment.
Figure 5:
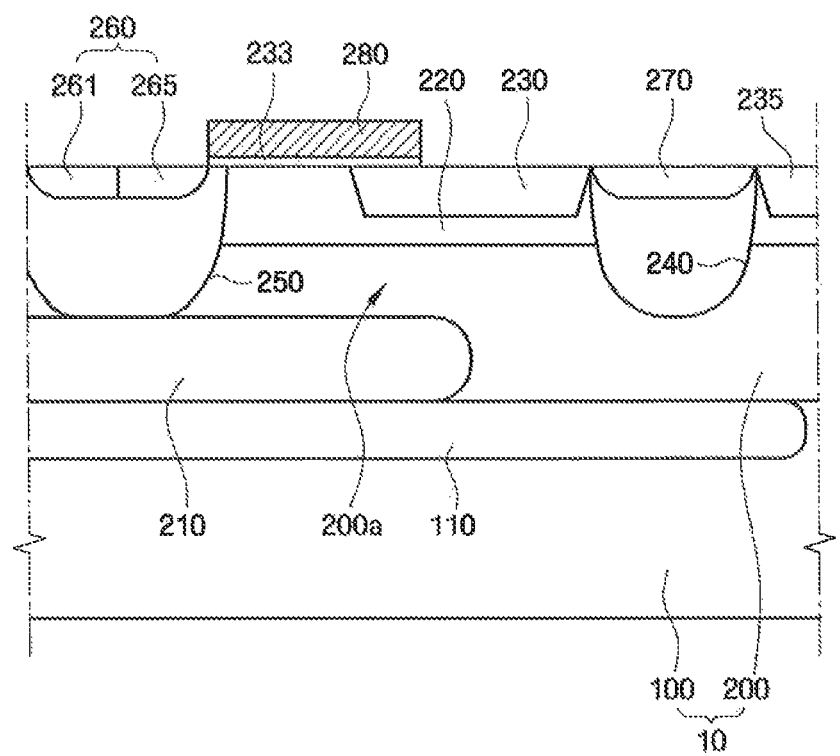

FIG. 1 is a layout illustrating a semiconductor device according to an exemplary embodiment. FIG. 2 is a sectional view taken along a line II-II' of FIG. 1. FIG. 3 is a diagram illustrating characteristics of a semiconductor device according to an exemplary embodiment. FIGS. 4 and 5 are views illustrating a semiconductor device according to another exemplary embodiment. A drift region is not illustrated in the layouts of FIGS. 1 and 4 to enhance understanding. However, embodiments are not limited thereto.

Referring to FIGS. 1 and 2, a semiconductor device, according to an exemplary embodiment, includes a gate 280 formed on a substrate 10, a body region 251, a source region 260, a first well 253 formed on one side of the gate 280, a drain region 270 formed on the other side of the gate 280, a first device isolation region 235, a second device isolation region 230, a drift region 220 formed in the substrate 10 and extending from the source region 260 to the drain region 270, and a first and a second buried layers 110 and 210 formed below the drift region 220.

The substrate 10 includes a P-type bulk substrate 100 and an N-type epitaxial layer 200 formed on the P-type bulk substrate 100. The bulk substrate 100 may include a silicon semiconductor substrate, a GaAs semiconductor substrate, a SiGe semiconductor substrate, a ceramic semiconductor substrate, a quartz semiconductor substrate, a glass semiconductor substrate, or a combination thereof.

The gate 280 is formed on the drift region 220 and a part of the second device isolation region 230. The gate 280, for example, may be formed with poly-silicon. However, it is not limited thereto. The gate 280 may be formed with various conductive materials, such as metal, or a combination of metal and poly-silicon, etc. A gate dielectric layer 233 is formed below the gate 280. The gate 280 is electrically isolated from the substrate 10.

The second device isolation region 230 is formed to separate the gate 280 from the drain region 270. The second device isolation region 230 prevents the semiconductor device from reliability deterioration. When a high voltage is applied to the drain region 270, reliability deterioration occurs due to a high electric field formed between the drain region 270 and the gate 280 edge. The second device isolation region 230, for example, may be formed with a Shallow Trench Isolation (STI). However, the present embodiment is not limited thereto. The present embodiment can be formed with a Local Oxidation of Silicon (LOCOS).

The source region 260 is formed at one side of the gate 280, and a source voltage is applied to the source region 260. The source region 260 may include a P-type first source region 261 and an N-type second source region 265. Although not shown in the drawing, a silicide layer can be formed on the source region 260 to reduce resistance between the source region 260 and a source electrode.

The P-type body region 251 is formed at one side of the gate 280. The body region 251 is formed below the source region 260 to surround the source region 260. The body region 251 may have a relatively low doping concentration compared to the source region 260 and the drain region 270. The doping concentration may be the concentration of impurity doped (or implanted) into each region.

The P-type first well 253 is formed at one side of the gate. The first well 253 is formed below the body region 251 and contacts the first buried layer 210. The first well 253 may have a relatively low doping concentration compared to the source region 260 and the drain region 270. For example, the first well 253 may have practically identical doping concentration to that of the body region 251. The first well 253 and a second well 240 can be formed using a mask. The mask is used during fabrication of CMOS transistors. The mask may be formed in a different region than the lateral DMOS transistor region.

The drain region 270 is formed at the other side of the gate 280. A drain voltage is applied to the drain region 270. Although not shown in the drawing, a silicide layer can be formed on the drain region 270 to reduce resistance between the drain region 270 and the drain electrode.

Below the drain region 270, an N-type second well 240 is formed. The N-type second well 240 is formed below the drain region 270 to surround the drain region 270. The N-type second well 240 may be extended below the drift region 220 toward the substrate 10. The N-type second well 240 can have a same conductive type as the drain region 270. However, the N-type well 240 may have a relatively low doping concentration compared to the drain region 270.

The N-type drift region 220 is formed so that it extends from the body region 251 to the drain region 270. The drain region 270 is in the substrate 10. The drift region 220 is between the body region 251 and the N-type well 240. The drift region may be formed on the epitaxial layer 200 and separated from the first buried layer 210. The drift region 220 may have the identical conductive type to that of the second well 240 and the epitaxial layer 200. The drift region 220 may have a relatively low doping concentration compared to the drain region 270 and the body region 251. Thus, when a reverse bias is applied to the source region 260 and the drain region 270, a depletion region can more easily be formed between the body region 251 and the drain region 270 in a lateral direction of the substrate 10. The depletion region may include, for example, the drift region 220, the epitaxial region 200a, and the second well 240. The epitaxial region 200a can be a part of the epitaxial layer 200. The epitaxial region 200a is between the body region 251 and the drain region 270.

According to the first exemplary embodiment, the drift region 220 has a relatively high doping concentration compared to the epitaxial layer 200. Thus, when a voltage, higher than a breakdown voltage, is applied to the source region 260 and the drain region 270, current may flow from the drain region 270 to the source region 260 more efficiently than to the epitaxial layer 200. When a voltage, higher than the breakdown voltage, is applied to the source region 260 and the drain region 270, current may flow from the source region 260 to the drain region 270 more efficiently through a current path.

The current path uses the drift region 220. Thus, the turn on resistance of the semiconductor device can be reduced.

According to the exemplary embodiment, since the epitaxial region 200a has a sufficiently low doping concentration and the drift region 220 has a relatively higher doping concentration than that of the epitaxial region 200a, the depletion region can be formed more easily between the body region 251 and the drain region 270 before the semiconductor device is turned on. The epitaxial region 200a is formed between the body region 251 and the drain region 270. Thus, the breakdown voltage is increased. After the semiconductor device is turned on, the current path using the drift region 220 is provided to decrease turn on resistance.

The P-type first buried layer 210 may be between the drift region 220 and the second buried layer 110. The first buried layer 210 may contact the first well 253 and can form an electric field. The electric field may be formed using source voltage in a vertical direction of the semiconductor device. In regions between the body region 251 and the drain region 270, an electric field is formed in the vertical as well as lateral directions, and reduced surface filled (RESURF) effect can be created. In particular, the regions between the body regions 251 and the drain region 270, where an electric field is formed, may include the drift region 220, the epitaxial region 200a, and the second well 240. The first buried layer 210 forms the depletion region in a vertical direction between the body region 251, the first well 253, and the drain region 270. Since the depletion region is formed in the vertical direction, the depletion region may be formed in the lateral direction more efficiently between the body region 251, the first well 253, and the drain region 270. When the depletion region is fully formed between the body region 251, the first well 253, and the drain region 270, the breakdown voltage does not depend on a doping concentration of the region between the body region 251 and the drain region 270. Therefore, the breakdown voltage of the semiconductor device can be increased, and turn on resistance can be decreased.

The first buried layer 210 can have a relatively high doping concentration compared to the drift region 220, the second well 240, and the epitaxial layer 200. The first buried layer 210 forms the depletion region in the vertical direction more easily. Thus, the first buried layer 210 forms the depletion region between the body region 251 and the drain region 270.

According to an exemplary embodiment, the first buried layer 210 is partially overlapped by the second device isolation region 230. The first buried layer 210 is not overlapped with the drain region 270. The first buried layer 210 is extended in one direction from the source region 260 to the drain region 270. The first buried layer 210 is placed below the first well 253. The first buried layer 210 may partially overlap the second device isolation region 230. The first buried layer may also overlap the half of the second device isolation region 230. Thus, the semiconductor, according to an exemplary embodiment, may have high breakdown voltage and low turn on resistance.

Figure 3A:
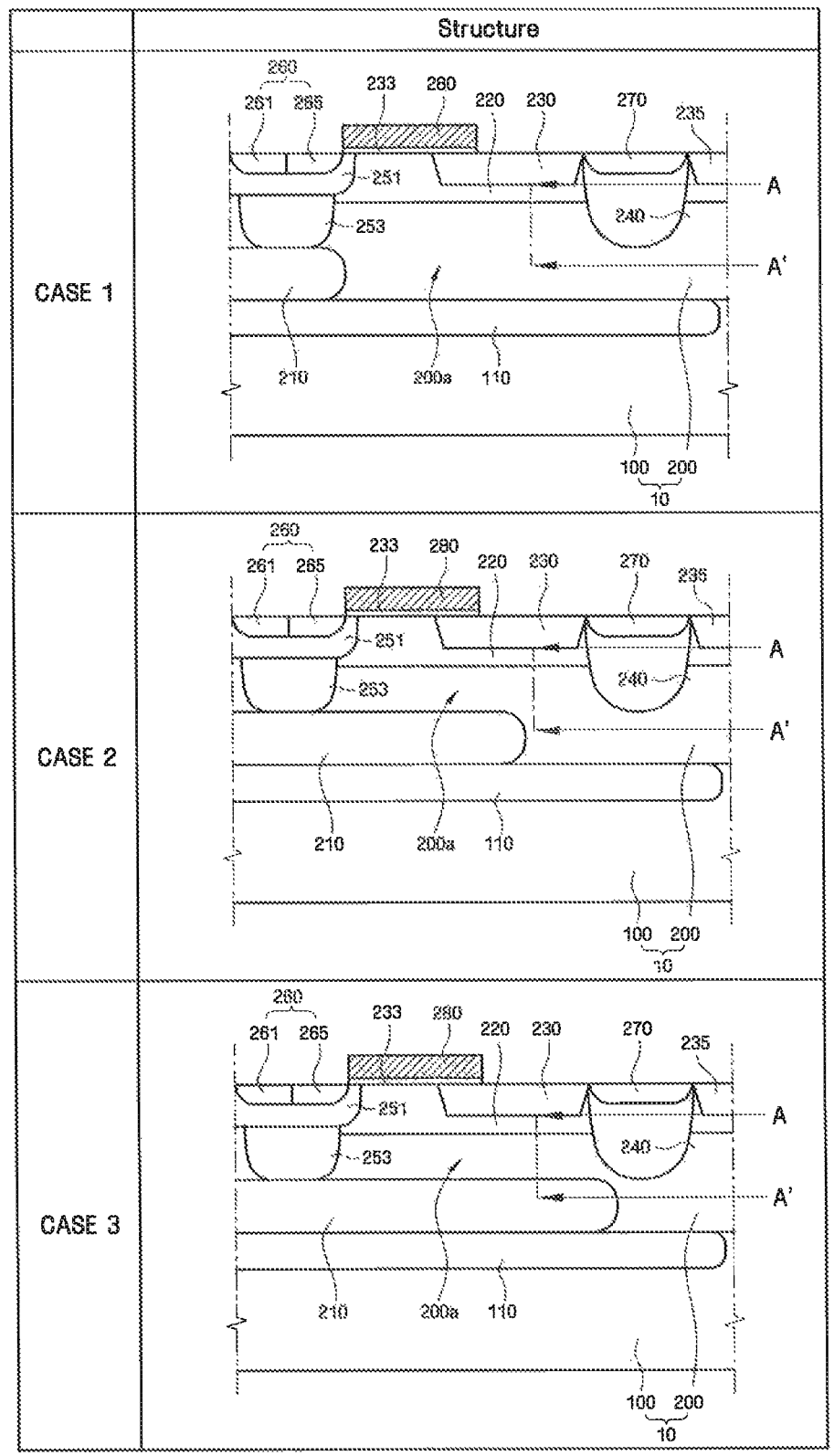
FIGS. 3A through 3C illustrate views of a semiconductor device according to an exemplary embodiment.
Figure 3B:
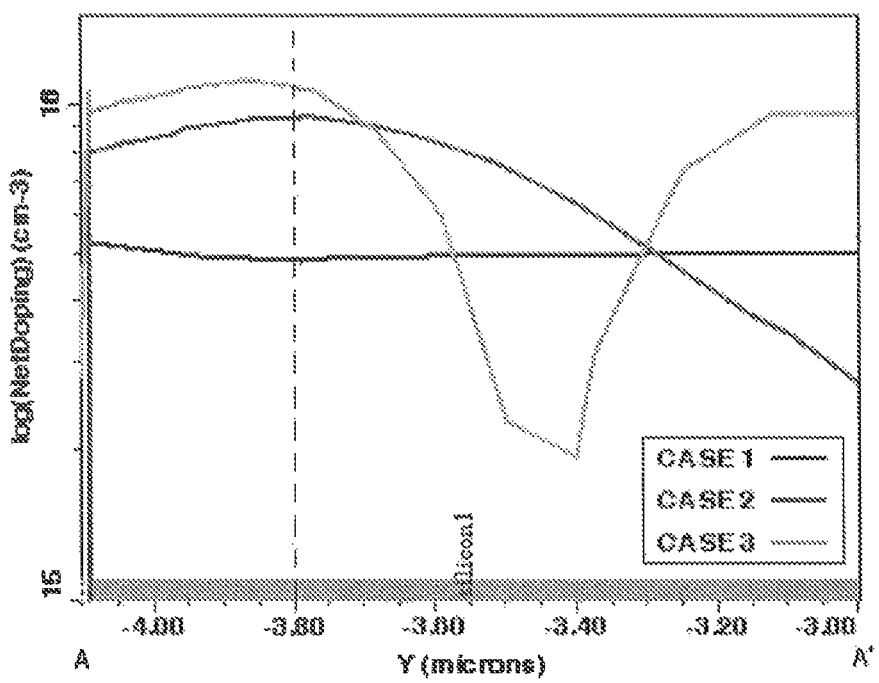
Figure 3C:
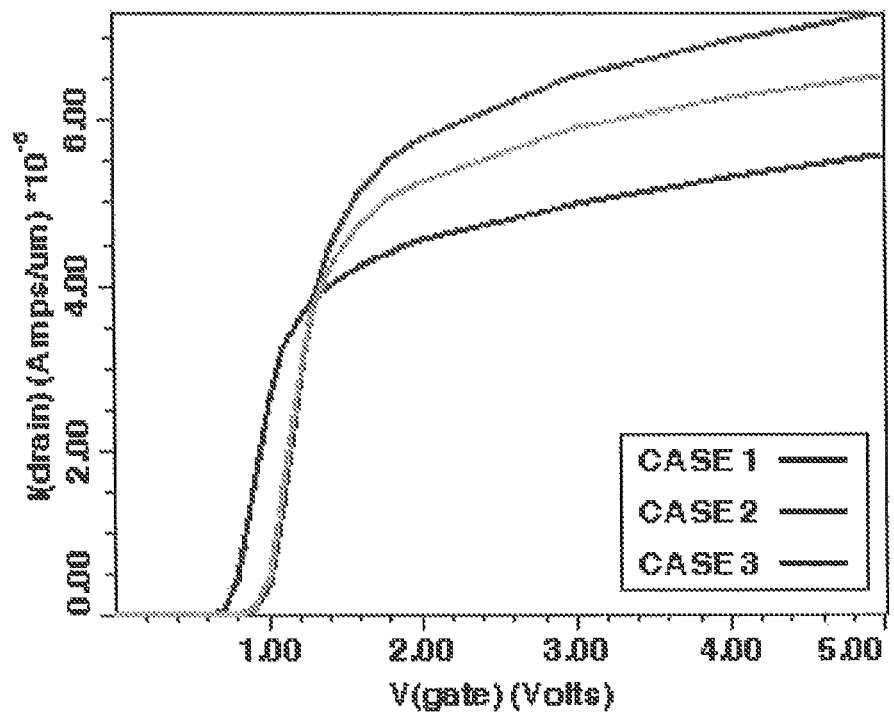

FIGS. 3A through 3C are views illustrating characteristics of a semiconductor device according to an exemplary embodiment. In particular, characteristics of semiconductor devices are illustrated depending on placement of a first buried layer.

Referring to FIG. 3A, case 1 represents the case where the first buried layer 210 may not overlap a second device isolation region 230 and overlaps the gate 280 edge or part of the gate 280. Case 2, like the exemplary embodiment, represents the case where the first buried layer 210 partially overlaps the second device isolation region 230, and does not overlap the drain region 270. Case 3 represents the case where the first buried layer 210 overlaps a part of a drain region 270 and the second device isolation region 230.

FIG. 3B is a graph showing the measurement results after forming a drift region 220 to satisfy a constant breakdown voltage. The measurements results show the doping concentration of cases 1-3 along the line A-A'. According to cases 1-3, the semiconductor device constant breakdown voltage may be, for example, 60 V.

Referring to FIG. 3B, the drift region 220 (refer to left region of a dotted line) has a lowest doping concentration in case 1 of the semiconductor device. The drift region 220 has a highest doping concentration in case 3 of the semiconductor device. In case 3, the depletion region was formed very well by the first buried layer 210. Thus, the doping concentration was increased. In case 1, the depletion region was relatively hard to form by the first buried layer 210. Thus, to satisfy the same breakdown voltage as case 3, the doping concentration needed to be decreased.

FIG. 3C is a graph showing measurement results of current flowing from the drain region 270 to the source region 260, which occurs according to the gate voltage. In cases 1-3, the semiconductor device has a constant drain voltage applied, for example, 0.1 V. Hereinafter, such current flowing from the drain region 270 to the source region 260 is called transistor current.

Referring to FIG. 3C, the transistor current of case 1 has the lowest value. As explained in FIG. 3B, this low value of case 1 occurs because the drift region 220 has the lowest doping concentration. Thus, case 1 of the semiconductor device has the highest turn on resistance.

In case 2, the transistor current has a larger value than that of case 3. The doping concentration of the drift region 220 in case 2 was smaller than case 3. In case 3, the doping concentration of the drift region 220 was high. However, an area of current path has the smallest value, in relation to case 1 and case 2. Thus, in case 2, although the doping concentration of the drift region 220 was lower than case 3, the area of current path was larger compared to case 3. Therefore, the semiconductor device of case 2 has the largest transistor current, and the smallest turn on resistance.

Therefore, case 2 of the semiconductor device, may have higher transistor current and lower turn on resistance, relative to cases 1-3. This scenario assumes that the identical breakdown voltage is provided in cases 1-3.

In FIG. 2, the N-type second buried layer 110 is below the drift region 220 and extends in one direction from the source region 260 to the drain region 270. The second buried layer 110 is formed on the bulk substrate 100. The second buried layer 110 assists the first buried layer 210 by forming the depletion region in the vertical direction between the body region 251 and the drain region 270. The second buried layer 110 receives a drain voltage through the second well 240 of the substrate 10. The second buried layer 110 forms a vertical electric field between the first and the second buried layers 110 and 210. Thus, the depletion region formed by the first buried layer 210 is formed on top of the substrate 10. The second buried layer 110 can have a relatively high doping concentration, compared to the first buried layer 210, to effectively form the depletion region. The depletion region is formed by the first buried layer 210 toward the top of substrate 10.

The earlier embodiments illustrate the semiconductor device including one source region 260, one body region 251, one gate 280, and a drain region 270. The earlier embodiments are not limited thereto. As illustrated in FIG. 4, in another exemplary embodiment, the semiconductor device may include source regions 260_1 and 260_2. The source regions 260_1 and 260_2 may include a first and second source regions 261_1, 261_2, 265_1, and 265_2, body regions 250_1 and 250_2, a first well (not shown), and a gate 281. The gate 281 may be placed symmetrically about a drain region 271. First buried layers 210_1 and 210_2 may be placed symmetrically around the drain region 271. In FIG. 4, although the gate 281 is illustrated as a rectangle shape, embodiments are not limited thereto.

In the earlier embodiments, the body region 251 and the first well 253 were formed below the source region 260. Thus, the source region 260 and the first buried layer 210 were connected to each other. However, the earlier embodiments are not limited thereto. As illustrated in FIG. 5, in another exemplary embodiment, a body region 250 is extended toward a bottom of a substrate 10 without a first well. Thus, a source region 260 and a first buried layer 210 can be connected to each other.

Figure 6:
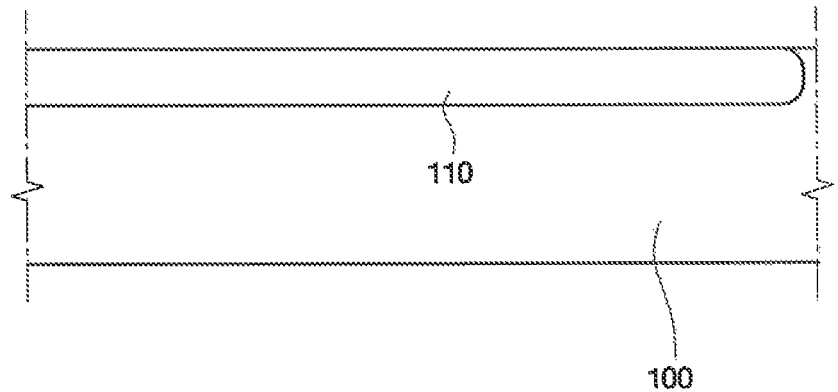
FIGS. 6 through 8 illustrate intermediate sectional views of stages in a method of fabricating a semiconductor device according to an exemplary embodiment.
Figure 7:
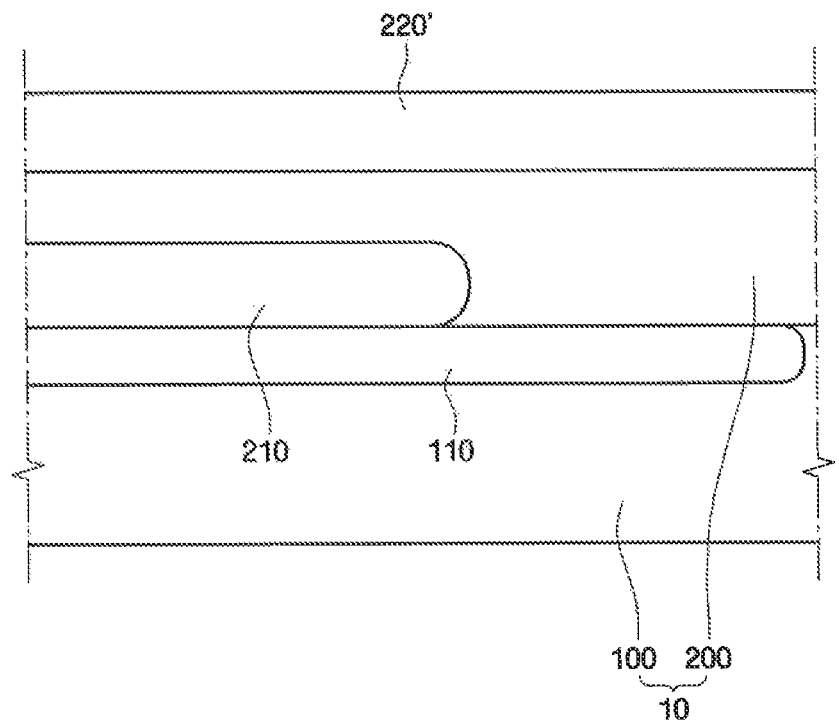
Figure 8:
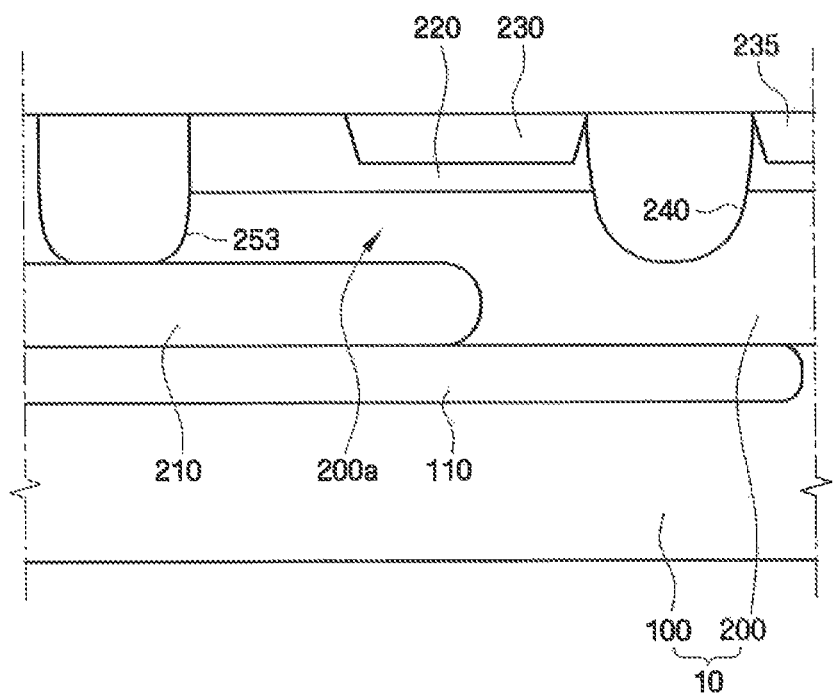

Referring to FIG. 2 and FIGS. 6-8, a method of fabricating a semiconductor device is described, according to an exemplary embodiment. FIGS. 6-8 are intermediate sectional views illustrating a fabricating method of a semiconductor device according to an exemplary embodiment.

Referring to FIG. 6, in a P-type bulk substrate 100 an N-type second buried layer 110 is formed. The second buried layer 110 can be formed by forming a mask pattern (not shown) that defines a region where the second buried layer 110 is formed on the bulk substrate 100, implanting N-type impurities on the bulk substrate 100, and removing the mask pattern. The second buried layer 110 can be formed to have a relatively higher doping concentration than a first buried layer 210 formed in the subsequent processes.

Referring to FIG. 7, an N-type epitaxial layer 200 is formed on the bulk substrate 100. The epitaxial layer 200 may be formed by Selective Epitaxial Growth (SEG) or Solid Phase Epitaxial (SPE) Growth.

In the epitaxial layer 200, the P-type first buried layer 210 and an N-type pre-drift region 220' are formed. The first buried layer 210 is formed by forming a mask pattern that defines a region where the first buried layer 210 is formed on the epitaxial layer 200, implanting P-type impurities until they reaches a top of the second buried layer 110 in the substrate 10, and removing the mask pattern. The pre-drift region 220' is formed by forming a mask pattern (not shown) that defines a region where the pre-drift region 220' is formed on the epitaxial layer 200, implanting N-type impurities on the top of epitaxial layer 200, and removing the mask pattern. The first buried layer 210 may have a higher doping concentration than that of the epitaxial layer 200 and lower doping concentration than the second buried layer 110. The pre-drift region 220' may have practically the same or higher doping concentration than that of the epitaxial layer 200.

In earlier embodiments, the pre-drift region 220' is formed after forming the first buried layer 210. However, earlier embodiments are not limited thereto. In another exemplary embodiment, the pre-drift region 220' can be formed before the first buried layer 210 can be formed.

Referring to FIG. 8, in the epitaxial layer 200 first and second device isolation regions 235 and 230 are formed. The first and second device isolation regions 235 and 230 can be formed using STI. However, the present embodiments are not limited thereto. The first and second device isolation regions 235 and 230 can be formed using other methods, including LOCOS.

An N-type second well 240 is formed between the first and second device isolation regions 235 and 230. A P-type first well 253 is formed at one side of the second device isolation region 230. The first and the second wells 253 and 240 are formed without using an additional mask. For example, a mask formed in different region than a lateral DMOS transistor region can be used. The mask is used during fabrication of CMOS transistors. The second well 240 can be formed by forming a mask pattern (not shown) that defines an area where the second well 240 is formed on the substrate 10 using the mask, implanting N-type impurities to a predetermined depth separated from the second buried layer 110 in the epitaxial layer 200, and removing the mask pattern. The first well 253 can be formed by forming a mask pattern (not shown) that defines an area where the first well 253 is formed on the substrate 10 using the mask, implanting P-type impurities into the epitaxial layer 200 until it reaches the top of the first buried layer 210, and removing the mask pattern.

Referring to FIG. 2, on the drift region 220 and part of the second device isolation region 230, a gate dielectric layer and a gate are formed. A pre-gate dielectric layer, e.g. silicon oxide and a pre-gate, e.g. poly-silicon is sequentially stacked on the substrate 10. Then, the pre-gate dielectric layer and the pre-gate are patterned to form the gate dielectric layer 233 and the gate 280.

A body region 251 is formed at one side of the gate 280. The body region 251 can be formed by forming a mask pattern (not shown) that defines an area where the body region 251 is formed, implanting P-type impurities, and removing the mask pattern. The body region 251 can be formed to have a higher doping concentration than that of the drift region 220 and the epitaxial layer 200.

At one side, e.g. a first side, of the gate 280, the source region 260 is formed. At the other side, e.g. a second side, of the gate 280, the drain region 270 is formed. The source region 260 may include a second source region 265 formed using N-type impurities. A first source region 261 may be formed using P-type impurities. The drain region 270 may also be formed using N-type impurities. The source region 260 and the drain region 270 can have higher doping concentration than the body region 251, the drift region 220, the first well 253, the second well 240, and the epitaxial layer 200.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
a gate on a substrate;
a source region at a first side of the gate;
a first conductive type body region under the source region;
a first well having the first conductive type under the body region;
a second conductive type drain region at a second side of the gate;
a device isolation region in the substrate between the source region and the drain region, the device isolation region overlaps at least a part of the gate; and
a first buried layer extends in a direction from the source region to the drain region, the first buried layer under the body region, the first buried layer overlapping part of the device isolation region, and the first buried layer not overlapping the drain region, wherein the first well contacts the first buried layer.

2. The semiconductor device as claimed in claim 1, wherein the first buried layer overlaps about half of the device isolation region.

3. The semiconductor device as claimed in claim 1, further comprising:
a second buried layer under the first buried layer, wherein the first buried layer is the second conductive type and the second buried layer is the first conductive type.

4. The semiconductor device as claimed in claim 1, further comprising:
a second well having the second conductive type at the second side of the gate.

5. The semiconductor device as claimed in claim 1, wherein the device isolation region is adjacent to the drain region and separated from the source region.

6. The semiconductor device as claimed in claim 1, wherein the source region includes:
a first source region, the first source region having the first conductive type; and
a second source region, adjacent the first source region, the second source region having the second conductive type.

7. The semiconductor device as claimed in claim 3, wherein a doping concentration of the first buried layer is higher than a doping concentration of the second buried layer.

8. The semiconductor device as claimed in claim 3, further comprising:
a drift region formed in the substrate on the first buried layer and separated from the first buried layer.

9. The semiconductor device as claimed in claim 8, wherein the substrate includes:
a bulk substrate having the first conductive type; and
an epitaxial semiconductor layer having the second conductive type formed on the bulk substrate, wherein the first buried layer is formed in the epitaxial semiconductor layer and the second buried layer is formed in the bulk substrate.

10. A semiconductor device, comprising:
a gate on a substrate;
a source region at the first side of the gate;
a drain region formed at the second side of the gate;
a body region having a first conductive type and being under the source region;
a first well having the first conductive type and being under the body region;
a second well having a second conductive type at the second side of the gate;
a device isolation region, adjacent to the drain region, in the substrate, the device isolation region overlapping part of the gate;
a first buried layer, extending in a direction from the source region to the drain region, the first buried layer being under the first well, the first buried layer having a first side where the first buried layer does not overlap the drain region,
a drift region formed in the substrate on the first buried layer and separated from the first buried layer; and
an epitaxial semiconductor layer having a second conductive type formed in the substrate, wherein, when a reverse bias is applied to the source region and the drain region, an electric field is formed on the first side of the first buried layer and the second side of the device isolation region is substantially identical.

11. The semiconductor device as claimed in claim 10, wherein: the first buried layer partially overlaps the device isolation region.

12. The semiconductor device as claimed in claim 10, further comprising:
a second buried layer under the first buried layer,
wherein the first buried layer is the second conductive type and the second buried layer is the first conductive type.

13. The semiconductor device as claimed in claim 12, wherein a doping concentration of the first buried layer is higher than a doping concentration of the second buried layer.

14. The semiconductor device as claimed in claim 10, wherein the device isolation region is adjacent to the drain region and separated from the source region.

15. The semiconductor device as claimed in claim 11, wherein:
the first buried layer overlaps about half of the device isolation region.

16. The semiconductor device as claimed in claim 12, wherein the substrate includes:
a bulk substrate having the first conductive type, the epitaxial semiconductor layer being second conductive type formed on the bulk substrate, wherein the first buried layer is formed in the epitaxial semiconductor layer and the second buried layer is formed in the bulk substrate.

17. The semiconductor device as claimed in claim 1, wherein the first buried layer only partially overlaps the device isolation region.

18. The semiconductor device as claimed in claim 11, wherein the first buried layer only partially overlaps the device isolation region.

* * * * *